United States Patent
Matsuoka et al.

(10) Patent No.: US 7,039,078 B2
(45) Date of Patent: May 2, 2006

(54) SEMICONDUCTOR OPTICAL MODULATOR AND LASER WITH OPTICAL MODULATOR

(75) Inventors: Takashi Matsuoka, Tokyo (JP); Hideki Fukano, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 268 days.

(21) Appl. No.: 10/665,515

(22) Filed: Sep. 16, 2003

(65) Prior Publication Data
US 2004/0062282 A1 Apr. 1, 2004

(30) Foreign Application Priority Data
Sep. 17, 2002 (JP) .............................. 2002-269729

(51) Int. Cl.
*H01S 3/10* (2006.01)
*H01S 5/00* (2006.01)
*H01S 5/20* (2006.01)
*H01S 5/323* (2006.01)
*G02B 26/00* (2006.01)

(52) U.S. Cl. .............. 372/26; 359/237; 372/45.01; 372/45.011; 372/45.012

(58) Field of Classification Search ............... 372/26, 372/45.01, 45.011, 45.012, 9, 11, 12, 27; 359/237
See application file for complete search history.

(56) References Cited

U.S. PATENT DOCUMENTS

| 5,671,242 A | 9/1997 | Takiguchi et al. |
| 5,923,688 A | 7/1999 | Nakamura |
| 5,963,358 A | 10/1999 | Shields |
| 6,526,083 B1 * | 2/2003 | Kneissl et al. ........... 372/50.22 |

FOREIGN PATENT DOCUMENTS

| GB | 2352326 | 1/2001 |
| JP | 08-086978 A | 4/1996 |
| JP | 10-294532 A | 11/1998 |
| JP | 2002-176196 A | 6/2002 |
| WO | WO 98/10544 | 3/1998 |
| WO | WO 00/76004 | 12/2000 |
| WO | WO 01/06286 | 1/2001 |

OTHER PUBLICATIONS

Bernardini et al., "Spontaneous polarization and piezoelectric constants of III-V nitrides", Phys. Rev. B, 56 (1997) R10024.
Osamura et al., "Fundamental absorption edge GaN, InN and their alloys", Solid State Comm., 11(1972)617.
Puychevrier et al., "Synthesis of III-V semiconductor nitrides by reactive cathodic sputtering", Thin Solid Films, 36(1976)141.

(Continued)

*Primary Examiner*—Minsun Harvey
*Assistant Examiner*—Marcia Golub
(74) *Attorney, Agent, or Firm*—Blakely Sokoloff Taylor & Zafman

(57) ABSTRACT

In a semiconductor optical modulator of this invention, each quantum-well layer and each barrier layer of a quantum-well structure serving as a light absorption layer are respectively made of $In_{1-X-Y}Ga_XAl_YN$ ($0 \leq X$, $Y \leq 1$, $0 \leq X+Y \leq 1$) and $In_{1-X'-Y'}Ga_{X'}Al_{Y'}N$ ($0 \leq X'$, $Y' \leq 1$, $0 \leq X'+Y' \leq 1$). An electric field is being generated in the light absorption layer by spontaneous polarization.

19 Claims, 10 Drawing Sheets

OTHER PUBLICATIONS

Tansley et al., "Optical band gap of indium nitride", J Appl. Phys., 59(1986)3241.

Matsuoka et al., "Wide-Gap Semiconductor (In, Ga) N", International Symposium on GaAs and Related Compounds, (Karuizawa, Japan, 1989); in Inst. Phys. Conf. Ser., 106. pp. 141-146.

Matsuoka, "Phase Separation in Wurtzite $In_{1-x-y}Ga_xAl_yN$", MRS Internet J. Nitride Semicond. Res. 3,54(1998).

Matsuoka et al., "Optical Bandgap Energy of InN", Extended Abstracts(the 36th Meeting); The Japan Society of Applied Physics and Related Societies, pp. 270 (1p-ZN-9) (1998).

Matsuoka et al., "Optical Bandgap Energy of InN", Extended Abstracts(the 49th Spring Meeting, 2002); The Japan Society of Applied Physics and Related Societies, pp. 392 (29p-ZM-1).

"Physics of high-power InGaN/GaN lasers", J. Piprek, et al, IEE Proceedings-Optoelectronics IEE UK, vol. 49, No. 4, Aug. 4, 2002, pp. 145-151.

"Quantum-Confined Stark Effect in an AlGaN/GaN/AlGaN Single Quantum Well Structure", Japanese Journal of Applied Physics, Part 2, vol. 38, No. 8B, Aug. 15, 1999, pp. L914-L916.

* cited by examiner

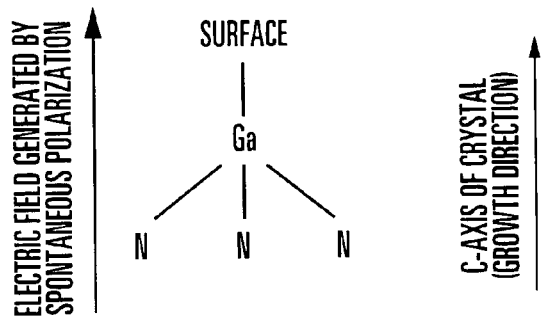
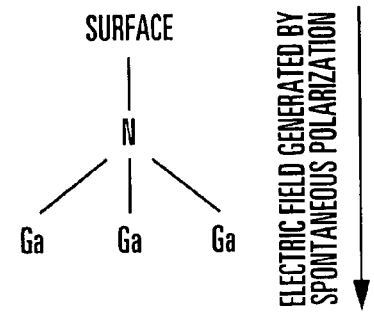
FIG.4A   FIG.4B
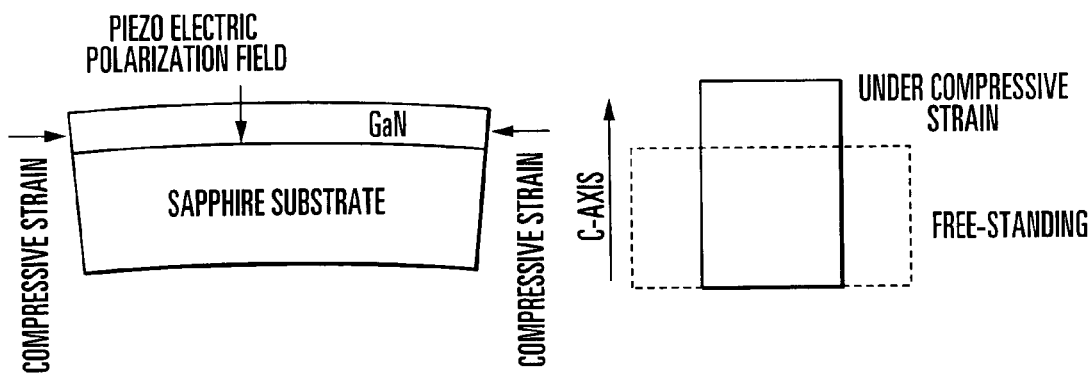
FIG.4C   FIG.4D

SEMICONDUCTOR OPTICAL MODULATOR AND LASER WITH OPTICAL MODULATOR

BACKGROUND OF THE INVENTION

The present invention relates to a semiconductor optical modulator of an optical waveguide type which uses a glass fiber as a transmission medium and is used for optical communication in a wavelength range of 1.3 to 1.5 μm and a laser with an optical modulator.

With the recent development of an advanced information-oriented society, optical communication networks using optical fibers have developed in various countries of the world, and many communications are made by optical communication for telephones and data transmission.

In order to realize optical communication using an optical fiber, an electric signal must be converted into an optical signal by using a transducer. A device for such electrooptic conversion is an optical modulator.

Optical modulation for electrooptic conversion includes modulators using two schemes, i.e., a direct modulation scheme and an external modulation scheme. In the direct modulation scheme, a semiconductor laser diode (LD) is used to directly convert a change in a modulation signal into a change in the intensity of a light source. In contrast to this, in the external modulation scheme, output light from a semiconductor laser under the continuous wave (CW) operation is externally modulated.

Direction modulation using a semiconductor laser allows a simple arrangement and a reduction in size. For this reason, direct modulation using a semiconductor laser has been widely used. In this modulation scheme, however, the transmission rate is limited by the chirping phenomenon of a semiconductor laser with a high frequency as high as several GHz or more. Chirping is a wavelength fluctuation phenomenon in which the refractive index of an active layer varies with temporal variations in carrier under high-speed modulation (several GHz or more) of the semiconductor laser, and the wavelength of emitted light varies.

In contrast to this, an external modulator modulates stable light from a semiconductor laser under CW operation by an electrooptic effect and the like, and hence is free from the problem of chirping. Therefore, this modulator allows long haul and high bit-rate transmission.

In optical communication, signal light in a wavelength range of 1.3 to 1.5 μm is used, and a silica fiber is mainly used as a transmission medium. In such optical communication, a semiconductor optical modulator made of a compound semiconductor (crystal) such as InGaAlAs or InGaAsP is used (see patent reference 1).

Recently, with advances in techniques of forming very thin compound semiconductor films, e.g., molecular beam epitaxy (MBE) or metalorganic vapor phase epitaxy (MOVPE), semiconductor multiple-quantum-well (MQW) structures and superlattice structures have made their appearances. These structures make it possible to make considerable improvements in the characteristics of optical devices, e.g., improvements in modulation speed and so on, as compared with conventional bulk semiconductors. Of these improvements, improvements in electroabsorption effect obtained by using an MQW structure for a light absorption layer and changing absorption coefficients by applying electric fields to the MQW structure are especially notable compared with bulk semiconductors.

As the above semiconductor optical modulator, a device that can be driven at higher speeds and lower voltages has been realized by using these characteristics. This semiconductor optical modulator is designed to apply a reverse-bias electric signal to a light absorption layer having an MQW structure, and to shift the absorption edge wavelength of an exciton, thereby modulating input CW light (light source) and converting an electric signal into an optical signal.

[Patent Reference 1]
Japanese Patent Laid-Open No. 8-86987

[Non-Patent Reference 1]
Fabio Bernardini, Vincenzo Fiorentini, and David Vanderbilt, "Spontaneous polarization and piezoelectric constants of III-V nitrides", Phys. Rev. B, 56 (1997) R10024

[Non-Patent Reference 2]
K. Osamura, K. Nakajima and Y. Murakami, "Fundamental absorption edge GaN, InN and their alloys", Solid State Comm., 11(1972)617

[Non-Patent Reference 3]
N. Puychevrier and M. Menoret, "Synthesis of III-V semiconductor nitrides by reactive cathodic sputtering", Thin Solid Films, 36(1976)141

[Non-Patent Reference 4]
T. L. Tansley and C. P. Foley, "Optical band gap of indium nitride", J. Appl. Phys., 59(1986)3241

[Non-Patent Reference 5]
T. Matsuoka, H. Tanaka, T. Sasaki and A. Katusi, "Wide-Gap Semiconductor (In, Ga) N", International Symposium on GaAs and Related Compounds, (Karuizawa, Japan, 1989); in Inst. Phys. Conf. Ser., 106. pp. 141–146

[Non-Patent Reference 6]
T. Matsuoka, "Phase Separation in Wurtzite $In_{1-X-Y}Ga_X Al_Y N$", MRS Internet J. Nitride Semicond. Res. 3,54(1998)

The conventional semiconductor optical modulators, however, have the following problems.

First of all, in a device using an InGaAsP-based material, the band discontinuity at the conduction band in a band structure is small. This device is therefore susceptible to the influences of operating temperatures. In the existing circumstances, therefore, a device using an InGaAsP-based material having a zincblende crystal structure is undesirably low in characteristic temperature, which is one of the important characteristics in practice. In an InGaAsP-based material, since there is no energy gap, i.e., spin split-off energy $\Delta sp$, between the heavy hole and the light hole at the Γ point in the valence band, the Auger effect is large. As a consequence, a device using an InGaAsP-based material has poor temperature characteristics.

In the above conventional semiconductor optical modulators, it is required to increase the shift amount of a wavelength. In order to increase the shift amount, however, a high voltage must be applied as the above reverse bias electric signal. This is because, in the existing circumstances, it is almost impossible to make a light absorption layer have an ideal state without any carrier. For example, impurities may diffuse into the light absorption layer from the p-type and n-type semiconductor layers formed on the upper or lower surfaces of the light absorption layer. As described above, in practice, carriers exist in the light absorption layer, and hence the light absorption layer cannot be completely depleted by the built-in voltage generated by a p-n junction. As a consequence, an electric signal applied to the light absorption layer is partially consumed for the depletion of the light absorption layer. The portion consumed for the depletion is required as a reverse bias electric signal.

A conventional semiconductor optical modulator is therefore required to resist a high reverse bias electric current. It is, however, not easy to grow a high-purity crystal having a high reverse breakdown voltage.

In addition, since an electronic circuit for operating an optical modulator cannot generate a high voltage under ultrafast operation, the operating voltage of the optical modulator must be minimized. For this purpose, a metal electrode formed on a semiconductor optical modulator needs to be in the state of ohmic contact between itself and a compound semiconductor layer of the semiconductor optical modulator. This indicates that the semiconductor layer with which the metal electrode is in contact has a high impurity concentration, and an active region formed from the above high-purity crystal is sandwiched by this layer with a high impurity concentration. In an external modulator for optical communication, of the materials which can be selected for layers sandwiching an MQW structure, InP has the maximum band-gap energy before the present invention. This band-gap energy is 1.42 eV. In this arrangement, when a high reverse bias is applied to increase the modulation degree, the layer around the quantum-well may be also subjected to dielectric breakdown.

An expensive crystal growth apparatus is required to manufacture such a structure in which a high-purity crystal layer and a crystal layer having a high impurity concentration are stacked on each other. In addition, a complicated process is required to grow crystal layers. That is, it is not easy to manufacture such a structure. Furthermore, many steps are required for a device manufacturing process following crystal growth. As a consequence, the above conventional semiconductor optical modulator requires a high cost to manufacture devices. Moreover, the manufacturing yield of devices is low, resulting in expensive devices.

Conventionally, a DC reverse bias and high-frequency electric signal must be simultaneously applied to a semiconductor optical modulator. For this reason, an electronic circuit component called a bias T must be used. When, for example, a semiconductor optical modulator is to be used at a communication rate of 10 Gbits/sec, the output band width required for the above electronic circuit component is DC to 60 GHz, resulting in high cost. In addition, it is difficult to obtain an electronic circuit component exhibiting good characteristics in an output range of DC.

The general arrangement and operation of a conventional optical modulator will be described in more detail below.

A conventional optical modulator has a crystal structure in which a lower cladding layer, undoped multiple-quantum-well layer, upper cladding layer, and p-type contact layer are sequentially stacked on each other. The MQW structure functions as an absorption layer which absorbs light, and constitutes an optical waveguide, together with the upper and lower cladding layers sandwiching the absorption layer. In addition, a p-electrode is formed on the contact layer, and an n-electrode is formed on the lower surface of the substrate.

Light incident through a light incident end face at one end of the optical waveguide is ON/OFF-modulated while propagating along the optical waveguide, and emerges from a light exist end face at the opposite end to the light incident end face. FIG. 14 shows the dependence of light absorption characteristics on a wavelength $\lambda$ at the time (OFF) when no voltage is applied between the p-electrode and the n-electrode and at the time (ON) when a reverse bias is applied between them. Referring to FIG. 14, the wavelength $\lambda$ of light incident on this optical modulator is shown as an operating wavelength $\lambda s$. When no voltage is applied, the light absorption coefficient at the operating wavelength $\lambda s$ is sufficiently small, and hence the incident light emerges from the light exit end face without any change. In contrast to this, when a sufficient reverse bias is applied, the absorption characteristic curve of the light absorption layer moves to the long-wavelength side, and hence the light absorption increases. As a result, no light emerges from the exit end. When the reverse bias voltage is turned on/off in this manner, light propagating along the optical waveguide is turned off/on, thereby transducing an electric signal into an optical signal.

A semiconductor layer structure that forms an optical modulator is formed by crystal growth. In this growth process, p-type and n-type dopants in the cladding layers on the upper and lower surfaces of the light absorption layer are diffused during the growth of the above semiconductor layer structure, and the diffused impurities invade the light absorption region. For this reason, the light absorption region is not completely depleted by a built-in voltage generated at the p-n junction. Therefore, a sufficient electric field is not generated in the MQW structure (light absorption layer) which controls the light extinction operation. Even if light absorption occurs once, electric charge generated by the light absorption remains, and no light absorption occurs any more. In other words, in the conventional optical modulator, light absorption hardly occurs. In contrast, when a reverse bias voltage is externally applied, the MQW structure is depleted, and light absorption increases as the reverse bias voltage to be applied increases, resulting in a large light extinction. FIG. 15 shows the voltage dependence of the extinction ratio, which explains this state. For the optimal operation, therefore, a complete depleted state must be set by externally applying a reverse bias voltage until the bias point shown in FIG. 15. For this purpose, an additional circuit such as a bias T is indispensable to the optimal operation. Assume that separate confinement heterostructure (SCH) layers that form an SCH exist between cladding layers and an MQW structure. In this case, even while a reverse bias voltage is externally applied, a weak electric field that barely causes depletion is applied to the upper and lower SCH layers sandwiching the light absorption layer. For this reason, in an optical modulator having an SCH structure, carriers generated by light absorption in the light absorption layer or the like can be extracted by only a weak electric field, and hence the traveling speed of carriers is low. In addition, the heterobarrier existing between the SCH layer and the cladding layer hinders carrier traveling, resulting in an increase in accumulation of carriers. When, therefore, high-intensity light is to be modulated, the amount of carriers generated by light absorption becomes larger than the amount of carriers extracted. The resultant accumulated carriers cause a nonuniform electric field or electric field shielding effect. This makes it impossible to realize high-speed operation. In order to suppress such carrier accumulation, there is available a technique of forming an SCH layer by using a semiconductor layer with a graded or abrupt composition and extracting carriers with maximum smoothness. This arrangement, however, extremely complicates crystal growth and requires a growth technique with extremely high precision, resulting in difficulty in manufacturing a device.

In a conventional device, upper and lower SCH layers are formed to a thickness equal to or more than the diffusion length of impurities so as to prevent p-type and n-type impurities in upper and lower cladding layers from reaching an MQW structure serving as a modulation layer with high concentrations even if they are diffused. This suppresses a deterioration in modulation function. Therefore, during modulation operation using a modulation voltage, the modulation voltage is applied throughout the upper and lower SCH layers and the MQW structure. However, only part of this modulation voltage is applied as an effective voltage component to the MQW structure which controls optical modulation characteristics. The voltage components applied to the upper and lower SCH layers are ineffective voltage components that do not directly contribute to modulation (high extinction) characteristics.

Although the device can be operated without externally applying a reverse bias voltage, a driving voltage having a very large amplitude equivalent to a bias is required. Furthermore, in this case, the electric field strength is not linear to voltage but is nonlinear thereto until the MQW structure is completely depleted. Reflecting the high extinction characteristics, therefore, the amplitude waveform of the transmitted light intensity is strongly distorted to exhibit extremely nonlinear characteristics.

As described above, the conventional semiconductor optical modulators are susceptible to the influences of operating temperatures. In addition, high reverse bias voltages must be externally applied to the modulators. For these reasons, various problems have arisen.

SUMMARY OF THE INVENTION

It is, therefore, a principal object of the present invention to provide a semiconductor optical modulator which stands the influences of operating temperatures. It is another object of the present invention to provide a semiconductor optical modulator which requires no application of a high reverse bias voltage. It is still another object of the present invention to provide a semiconductor optical device which can improve a situation in which an MQW structure (including an SCH layer in a device structure having the SCH layer) cannot be completely depleted by the built-in voltage generated by the formation of a p-n junction owing to, for example, increases in the amount of residual impurities in the above MQW structure and the amount of p-type and n-type impurities diffused into the above MQW structure from the upper and lower cladding layers, can perform optimal operation without externally applying any reverse bias voltage, can realize high-speed operation for modulation of high-intensity light without accumulating carriers, uses a low modulation voltage, and exhibits small nonlinearity with respect to driving voltage.

In order to achieve the above objects, according to an aspect of the present invention, there is provided a semiconductor optical modulator comprising at least a lower cladding layer of a first conductivity type, a light absorption layer which is formed on the lower cladding layer and has a quantum-well structure constituted by a quantum-well layer and a barrier layer, and an upper cladding layer of a second conductivity type formed on the light absorption layer, wherein the quantum-well layer is made of $In_{1-X-Y}Ga_XAl_YN$ ($0 \leq X, Y \leq 1, 0 \leq X+Y \leq 1$), the barrier layers are made of $In_{1-X'-Y'}Ga_{X'}Al_{Y'}N$ ($0 \leq X', Y' \leq 1, 0 \leq X'+Y' \leq 1$), and an optical waveguide having a light incident end is constituted by the lower cladding layer, the light absorption layer, and the upper cladding layer.

With this arrangement, the light absorption layer is made of a material with a small Auger effect. In addition, an electric field is generated in the light absorption layer by polarization.

BRIEF DESCRIPTION OF THE DRAWINGS

FIG. 4A is a view showing the stacking order of a Ga atom and N atoms of single-crystal GaN grown along the c-axis;

FIG. 4B is a view showing the stacking order of Ga atoms and a N atom of single-crystal GaN grown along the c-axis;

FIG. 4C is a schematic sectional view showing how a strain is produced in GaN grown on a sapphire substrate;

FIG. 4D is a view showing the extension and contraction of the crystal lattice of GaN formed on the sapphire substrate;

DESCRIPTION OF THE PREFERRED EMBODIMENTS

The embodiments of the present invention will be described in detail below with reference to the accompanying drawings.

First Embodiment

The first embodiment of the present invention will be described first.

Figure 1A:
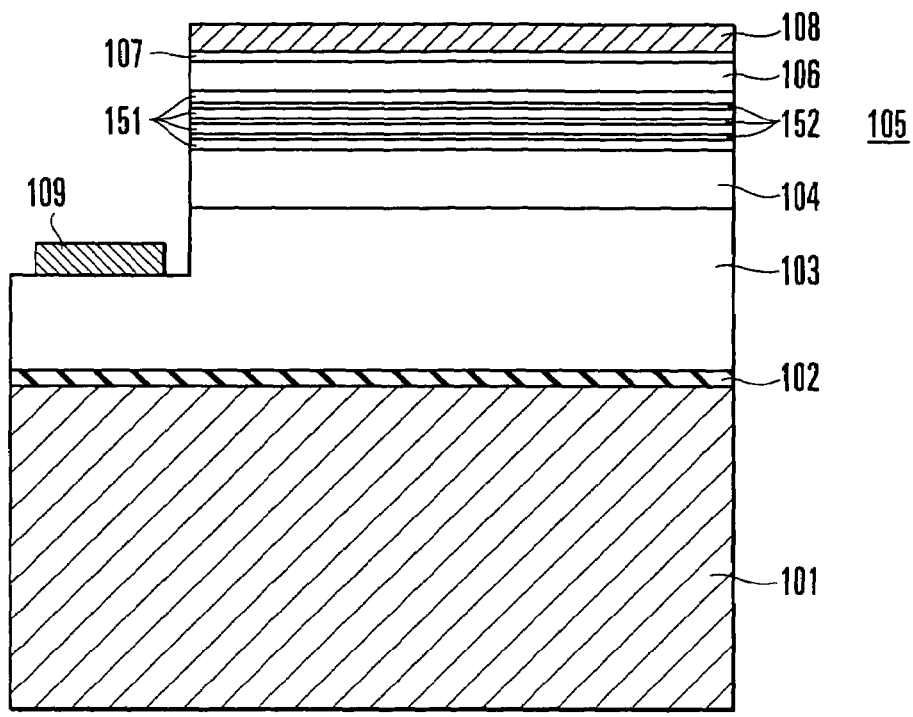
FIG. 1A is a schematic sectional view showing an example of the arrangement of a semiconductor optical modulator according to the first embodiment of the present invention.
Figure 1B:
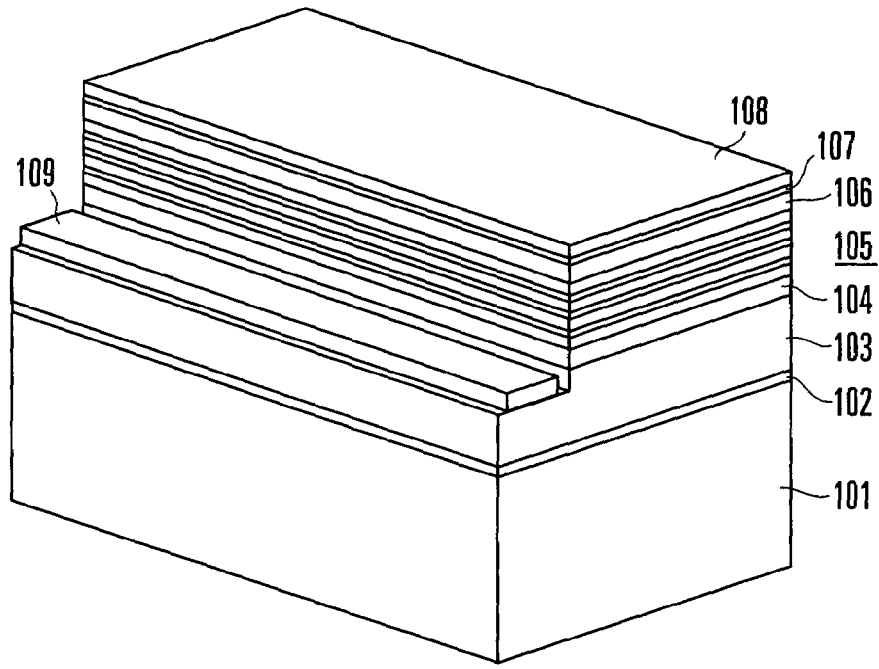
FIG. 1B is a schematic perspective view showing an example of the arrangement of the semiconductor optical modulator according to the first embodiment of the present invention.

FIG. 1A schematically shows an example of the arrangement of a semiconductor optical modulator according to an embodiment of the present invention. FIG. 1B schematically shows the arrangement of the semiconductor optical modulator. Note that in the following description, compound semiconductor materials such as GaN, AlGaN, AlN, and InN are single crystals unless otherwise specified.

This semiconductor optical modulator has a buffer layer 102, electrode layer 103, and cladding layer 104 on a nitrided surface of a 330-μm thick single-crystal substrate 101 made of (0001)-oriented sapphire (α-$Al_2O_3$ crystal). The buffer layer 102 is 20 nm thick and made of GaN. The electrode layer 103 is 4 μm thick and made of Mg-doped p-type GaN. The cladding layer 104 is 0.5 μm thick and made of Mg-doped p-type $Al_{01}Ga_{0.9}N$. Note that the single-crystal substrate 101 is not limited to sapphire and may be made of a crystal such as silicon carbide (SiC), zinc oxide (ZnO), or lithium gallate ($LiGaO_2$).

A light absorption layer 105 having an MQW structure is formed on the cladding layer 104. The light absorption layer 105 has a multilayer structure constituted by barrier layers 151 made of undoped GaN which is an InGaAlN-based material and quantum-well layers 152 made of undoped InN. Note that the quantum-well layers 152 may be made of $In_{1-X-Y}Ga_XAl_YN$ ($0 \leq X$, $Y \leq 1$, $0 \leq X+Y \leq 1$), and the barrier layers 151 may be made of $In_{1-X'-Y'}Ga_{X'}Al_{Y'}N$ ($0 \leq X'$, $Y' \leq 1$, $0 \leq X'+Y' \leq 1$). Combinations of these compositions will be described in detail later. Note that the light absorption layer 105 may have a quantum-well structure, which may be a single quantum-well structure.

The thickness of each quantum-well layer 152 is set to be equal to or less than the spread of the wavefunction of an electron so as to obtain an quantum effect. The thickness of each barrier layer 151 may be set such that the wavefunctions do not almost overlap between the barrier layer 151 and the quantum-well layer 152. In this case, the lattice constant of the material for the quantum-well layers 152 is larger than that for the barrier layers 151. In this embodiment, five barrier layers 151 and three quantum-well layers 152 are stacked on each other. The number of layers stacked may be properly set in accordance with the state of light absorption, and may be set to a different number.

A 0.5-μm thick cladding layer 106 made of Si-doped n-type $Al_{0.1}Ga_{0.9}N$ is formed on the light absorption layer 105.

In the semiconductor optical modulator shown in FIG. 1, therefore, an optical waveguide having a light incident end and light exit end is constituted by the cladding layer 104, light absorption layer 105, and cladding layer 106.

The semiconductor optical modulator in FIG. 1 also has a 0.1-μm thick contact layer 107 made of Si-doped n-type GaN and an n-type metal electrode 108. Although not shown, the n-type metal electrode 108 has a multilayer structure constituted by a 50-nm thick aluminum layer in direct contact with the contact layer 107 and a 200-nm thick gold layer.

Note that the electrode layer 103 has an exposed region formed by partially etching the respective layers above the electrode layer 103. A p-type metal electrode 109 is formed on this exposed region. Although not shown, the p-type metal electrode 109 has a multilayer structure constituted by a 50-nm thick nickel layer in direction contact with the exposed region and a 200-nm thick gold layer formed thereon.

In this embodiment, as described above, the semiconductor optical modulator is made of an InGaAlN-based material which is a wurtzite crystal. As a consequence, the light absorption layer 105 is made of a material with a small Auger effect, and hence stands the influences of operating temperatures.

In the above embodiment, as InGaAlN-based materials, InN and GaN are used for the light absorption layer 105 to form an MQW structure. These wurtzite crystals have an electrical polarization effect which does not exist in zincblende structure crystals. Owing to this electrical polarization effect, polarization is produced in the light absorption layer 105 without any bias. Even if carriers exist in the light absorption layer 105, the light absorption layer 105 can be set in a depleted state. As described above, in the semiconductor optical modulator according to this embodiment, the light absorption layer 105 is made of an InGaAl-based material, and polarization is produced without any bias. This makes it possible to modulate light by application of a forward bias voltage without any voltage drop for depletion.

As described above, according to the present invention, since a light absorption region is depleted by a built-in voltage generated by the formation of a polarization field and p-n junction, the modulator can be operated optimally without applying any external reverse bias voltage, and can be operated at high speed without accumulation of carriers in modulating light with high intensity.

A polarization effect will be described in more detail below.

Figure 2A:
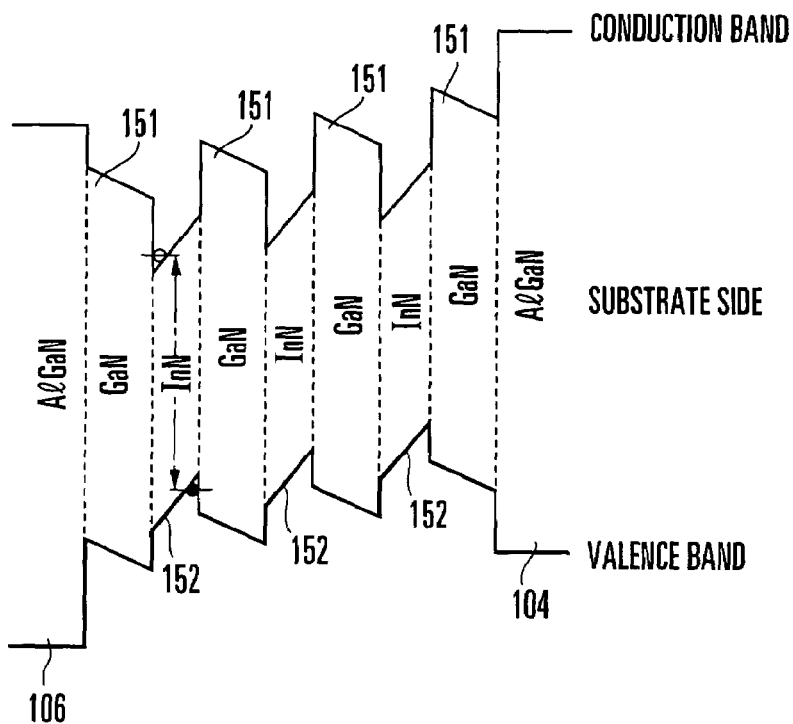
FIG. 2A is a band diagram showing the band diagram of part of the semiconductor optical modulator according to the first embodiment of the present invention.
Figure 2B:
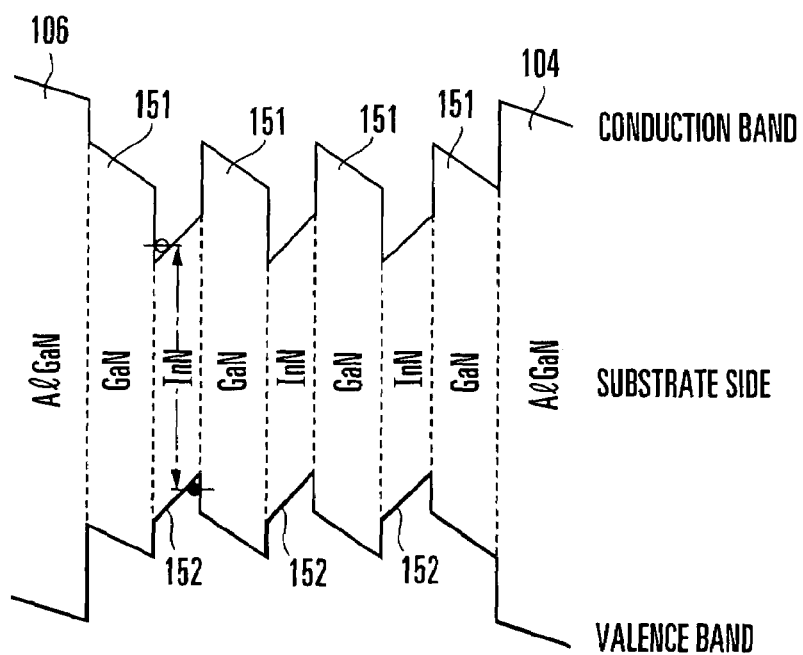
FIG. 2B is a band diagram showing the band diagram of part of the semiconductor optical modulator according to the first embodiment of the present invention.

When an MQW structure is formed by stacking a quantum-well layer and barrier layer made of InGaAlN-based materials which are wurtzite crystals, spontaneous polarization held in the crystals themselves always occurs. In addition, in this embodiment, since the lattice constant of the quantum-well layer is larger than that of the barrier layer, piezoelectric polarization caused by crystal strain (compressive strain in this case) due to lattice-mismatch exists. In the light absorption layer 105 having the above structure, the spontaneous polarization and piezoelectric polarization due to compressive strain act in the same direction. For this reason, in the MQW structure forming the light absorption layer 105, an electric field is generated by the polarization obtained by adding spontaneous polarization to the above piezoelectric polarization. The band diagram in the layer structure centered on the light absorption layer 105 which is shown in FIGS. 1A and 1B and has the above arrangement becomes the one shown in FIGS. 2A and 2B. FIG. 2A shows a state (non-bias state) wherein no forward bias voltage is applied, and FIG. 2B shows a state wherein a forward bias voltage is applied. In this case, the p-type metal electrode 109 serves as an anode, and the n-type metal electrode 108 serves a cathode. Referring to FIGS. 2A and 2B, an electron and hole constituting an exciton are respectively indicated by open and filled circles.

As shown in FIG. 2A, in the MQW structure (light absorption layer 105), the electron and hole constituting the exciton in the quantum-well layer 152 are spatially separated from each other. In this embodiment, the distance between the electron and the hole (band-gap energy difference) changes as a forward bias voltage is applied. As shown in FIG. 2B, when a forward bias voltage is applied, the gradient of the band in the quantum-well layer 152 decreases, and the distance between the electron and the hole which constitute the exciton increases (the band-gap energy difference increases). As a consequence, the absorption edge wavelength of the exciton decreases as compared with a state wherein no voltage is applied. In this embodiment, therefore, when the wavelength of light incident on the light incident end of the semiconductor optical modulator is shorter than the absorption edge wavelength without any bias and longer than the absorption edge wavelength upon application of a forward bias, the light is transmitted through the modulator and output only when a forward bias is applied.

As described above, in the semiconductor optical modulator according to this embodiment, the wavelength of light absorbed by the light absorption layer 105 changes upon application of a forward bias voltage. According to the semiconductor optical modulator of this embodiment, therefore, light incident on the light absorption layer 105 can be modulated by application of a forward bias voltage and output. In addition, since the semiconductor optical modulator according to this embodiment is a device that can be operated by applying a forward bias voltage, no crystal having high resistance to a reverse bias voltage is required unlike the conventional device. This makes it possible to simplify a crystal growth apparatus for manufacturing devices and simplify the crystal growth process as well. This can also improve the manufacturing yield of devices. According to this embodiment, therefore, a semiconductor optical modulator which can be easily manufactured can be provided.

In an MQW structure made of a compound semiconductor, TE polarized light is absorbed by both an exciton composed of a heavy hole and an electron and an exciton composed of a light hole and an electron, whereas TM polarized light is absorbed by only an exciton composed of a light hole and an electron. For this reason, in order to modulate light regardless of the type of polarization, spectra generated by the two kinds of excitons need to coincide with each other.

Figure 3A:
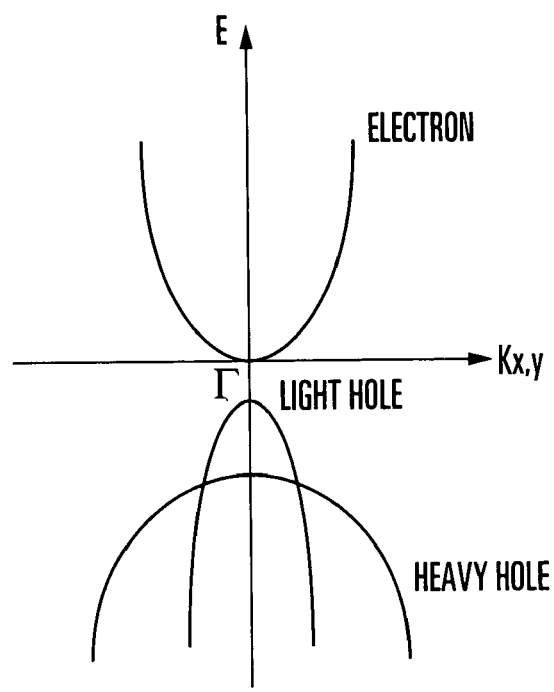
FIG. 3A is a view showing the band diagram of a wurtzite crystal in which a tensile strain is applied to a quantum-well layer of a quantum-well structure.
Figure 3B:
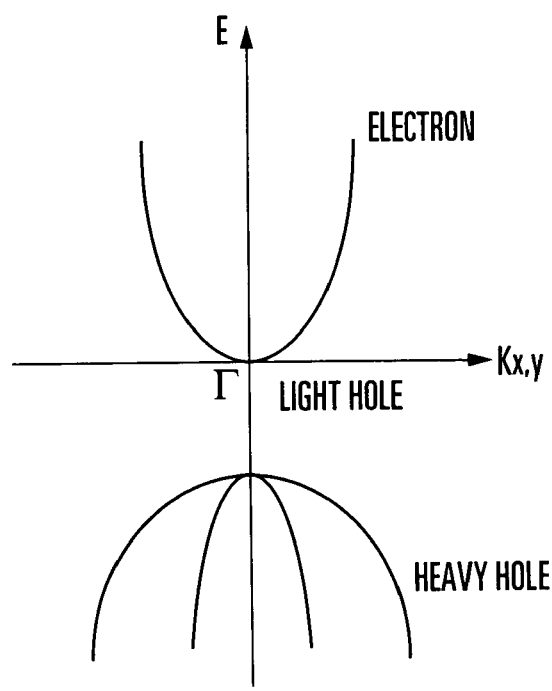
FIG. 3B is a view showing the band diagram of a wurtzite crystal in which a tensile strain is applied to a quantum-well layer of a quantum-well structure.

FIG. 3A shows the band diagram of a wurtzite crystal which gives a tensile strain to a quantum-well layer having a quantum-well structure. At the Γ point, the energy level of a light hole can be designed to be much lower than that of a heavy hole. In addition, as shown in FIG. 3B, the energy bands of the two holes can be made to coincide with each other.

The degree of freedom in design of a band structure in the above wurtzite crystal is much higher than that in a zincblende crystal owing to the polarization effect within the crystal. It is therefore very easy to make the spectra generated by the two excitons coincide with each other in the absence of an electric field, as described above. This allows the optical modulator using the wurtzite crystal according to this embodiment to perform modulation without any light-polarization dependence.

Note, however, the direction of piezoelectric polarization produced by a tensile strain may coincide with or differ from the direction of spontaneous polarization of a wurtzite crystal. This is because the direction of spontaneous polarization depends on the polarity of a crystal. Depending on a combination of materials, therefore, the magnitude of spontaneous polarization may be equal to that of piezoelectric polarization, and hence the polarization effects may cancel each other. As a consequence, no electric field may be generated. In such a case, in order to obtain a polarization effect, materials must be combined such that the magnitude of piezoelectric polarization caused by a tensile strain differs from that of spontaneous polarization.

FIGS. 4A and 4B show the stacking orders of Ga and N atoms in a single crystal obtained by crystal growth of GaN along the c-axis. The stacking orders correspond to the polarities. As shown in FIG. 4A, a state wherein three N atoms combine with each other above a Ga atom when viewed from the surface of single-crystal GaN is called Ga polarity or +c polarity. In contrast, as shown in FIG. 4B, a state wherein three Ga atoms combine with each other above an N atom when viewed from the surface of single-crystal GaN is called N polarity or −c polarity. This polarity is irrelevant to whether the surface of single-crystal GaN is composed of Ga or N atoms. For example, adsorption atoms also exist in the surface of single-crystal GaN. In this case, even with the Ga polarity, N atoms may exist in the surface. Even in this case, in the internal structure of the crystal, the stacking order of atoms can be seen in consideration of the number of bonds between atoms. The internal structure remains unchanged regardless of phenomena on the surface and the kinds of atoms adsorbed on the surface, and hence the polarity of a crystal is uniquely determined.

When GaN is regarded as a dielectric material, the direction of a polarization electric field is determined by the polarity. Polarization determined by the polarity is called spontaneous polarization. FIGS. 4A and 4B show the relationship between the polarity and spontaneous polarization. If a grown crystal has the Ga polarity, an electric field generated by spontaneous polarization is directed from the inside of the crystal to its surface. If the grown crystal has the N polarity, the electric field generated by spontaneous polarization is directed from the surface of the crystal to its inside.

The following is a case with piezoelectric polarization. A case wherein a single-crystal GaN layer is formed by crystal growth on a sapphire substrate whose major surface is a (0001) plane (c-plane) will be described below. Crystal growth is generally performed at a temperature higher than room temperature, and the device is used at room temperature. The lattice constant of GaN along the a-axis is larger than that of sapphire. The thermal expansion coefficient of sapphire along the a-axis is larger than that of GaN. As a consequence, at room temperature, a strain is produced in GaN grown on the sapphire substrate, as indicated by the schematic sectional view of FIG. 4C. This strain acts in a direction parallel to the interface between the sapphire substrate and GaN, and acts as a compressive strain on GaN. The compressive strain in this case is a biaxial strain.

For this reason, the crystal lattice of GaN formed on the sapphire substrate contracts in a direction parallel to the interface and extends in a direction perpendicular to the interface, as shown in FIG. 4D. As a consequence, as shown in FIG. 4C, an electric field is generated by piezoelectric polarization in a direction perpendicular to the interface, i.e., a direction parallel to the c-axis. The direction of this piezoelectric polarization depends on the direction of a strain. In the case of a compressive strain, the piezoelectric polarization is directed to the sapphire substrate (FIG. 4C). In the case of a tensile strain, the piezoelectric polarization is opposite in direction to that in the case shown in FIG. 4C, i.e., directed from the sapphire substrate to the GaN layer.

Note that spontaneous polarization charges in AlN, GaN, and InN are 0.081, 0.029, and 0.032 $C/m^2$. These values are much larger than the charge in a crystal having a perovskite structure which is a ferroelectric substance. A piezoelectric-polarization charge $P_{piezo}$ is given by $$P_{piezo}(C/m^2) = e_{33}(c-c_0)/c_0 + e_{31}(a-a_0)/a_0 \quad (1)$$

where $c_0$ is a lattice constant along the c-axis under no strain, c is a lattice constant along the c-axis in the presence of a strain, $a_0$ is a lattice constant along the a-axis under no strain, and a is a lattice constant in the presence of a strain along the a-axis.

In addition, $e_{33}$ and $e_{31}$ are piezoelectric coefficients, which have values shown in Table 1 given below.

TABLE 1

Piezoelectric Coefficients of Nitrides

| Material | $e_{33}$ | $e_{31}$ |
|---|---|---|
| AlN | 1.46 | −0.60 |
| GaN | 0.73 | −0.49 |
| InN | 0.92 | −0.57 |

Semiconductors

The number of values shown in Table 1 is about ⅓ that of perovskite crystals.

For example, the deformation of a GaN crystal and the estimated magnitude of piezoelectric polarization will be presented here. Assume that the volume of the crystal is constant. When the single-crystal GaN is extended by 10% along the c-axis, the a-axis contracts by 4.7%. In this case, the piezoelectric polarization charge $P_{piezo}$ is given by "$P_{piezo}$=0.73×0.1+0.49×0.047=0.096" (see non-patent reference 1).

In summary, if polarization is produced in the light absorption layer in the absence of a bias, optical modulation can be done without applying a high reverse bias voltage. A state wherein polarization is produced in the absence of a bias can be obtained when, for example, spontaneous polarization is produced in the light absorption layer. If, for example, a quantum-well layer is made of InGaN and a barrier layer is made of InGaAlN, spontaneous polarization can be produced in the light absorption layer. In addition, InGaN and InGaAlN can have similar lattice constants unless the piezoelectric polarization is necessary.

A state wherein polarization is produced in the absence of a bias can be obtained if spontaneous polarization and piezoelectric polarization are produced in the light absorption layer, and the sum of their magnitudes is not 0. A state wherein piezoelectric polarization is produced in addition to spontaneous polarization in the light absorption layer can be obtained if the lattice constant of the quantum-well layer differs from that of the barrier layer. If, however, spontaneous polarization and piezoelectric polarization are equal in magnitude and different in direction, since they cancel each other, a state wherein polarization is produced in the light absorption layer in the absence of a bias cannot be obtained.

In states other than this state, even if piezoelectric polarization is produced, polarization is produced in the light absorption layer in the absence of a bias. Assume that a quantum-well layer is made of InN and a barrier layer is made of GaN. In this case, in addition to spontaneous polarization in the direction in this embodiment, piezoelectric polarization is produced in the light absorption layer in the same direction.

An InGaAlN-based compound semiconductor which forms a semiconductor optical modulator according to this embodiment will be described next.

Conventionally, there has been no idea of applying InGaAlN materials to semiconductor optical modulators in the wavelength region of 1.3 μm to 1.58 μm which is used in the optical communication system. This was because the band-gap energy (Eg) of InN, which has the smallest Eg among these materials, was 1.9 to 2.1 eV.

In the times when such Eg was measured, InN was formed by reactive sputtering or the like, and only polycrystalline InN could be formed. That is, the above band-gap measurement result was obtained from polycrystalline InN (see non-patent references 2, 3, and 4).

Of compounds AlN, GaN, and InN constituting InGaAlN, the equilibrium vapor pressure of nitrogen on the solid phase of InN is five orders of magnitude higher than those of the remaining compounds (see non-patent reference 5). It is almost impossible to form a high-quality crystal using InN having such characteristics by a method like reactive sputtering in which the pressure in a vessel (e.g., a vacuum chamber) used for the formation of a film cannot be increased. In the above times, since attempts were also made to form an InN film on a glass substrate, no lattice information about single-crystal growth could be obtained from the substrate, and no single crystal could be grown.

Under the circumstances, the present inventors tried to grow single-crystal InN on a single-crystal sapphire substrate by using metalorganic vapor phase epitaxy (to be referred to as MOVPE hereinafter) in which a nitrogen pressure can be applied, and achieved the world's first success in single-crystal growth in 1988. The present inventors reported this result at an academic conference in 1989 (non-patent reference 5).

The crystallinity of the single crystal obtained at this time, however, was insufficient, and hence this technique fell short of obtaining the optical characteristics of InN. The present inventors made various technical improvements afterward, and achieved the world's first success in growing high-quality single-crystal InN whose optical characteristics could be measured in 2001 (Takashi Matusoka, Masahi Nakao, Hiroshi Okamoto, Hiroshi Harima, Eiji Kurimoto, and Megumi Hagiwara, "OPTICAL BANDGAP ENERGY of InN", Ext. Abstr. 36th Spring Meeting of the Japan Society of Applied Physics and Related, p. 392(29p-ZM-1) (2002); the deadline for a manuscript in the Japan Society of Applied Physics: Jan. 8, 2002; the meeting: from 27 to 30 March; and the announcement date: March 29).

The first technical improvement to grow the above high-quality single-crystal InN was to form in advance GaN having an intermediate lattice constant between those of sapphire and InN on a sapphire substrate. In this case, a GaN layer is required to have high crystallinity. For this reason, the growth conditions for GaN were optimized in the following points:
1. cleaning of the surface of a sapphire substrate in the reactor;
2. nitridation of the sapphire surface with ammonia;
3. low-temperature growth of GaN as a buffer layer to reduce lattice-mismatch between sapphire and GaN;

4. high-temperature annealing to form the above buffer layer into a single crystal; and
5. high-temperature growth of high-quality GaN.

The second technical improvement was to investigate the growth conditions for InN on GaN grown under the conditions optimized in the above manner. The items investigated were a growth temperature, a growth rate, the ratio of a Group V source to an In source, a gas flow rate in the reactor, and the like. As a result of the investigation on these items, the present inventors made the first success in growing InN whose optical characteristics could be measured. At present, an InN layer can be directly formed on a sapphire layer without forming any GaN template therebetween.

Figure 5:
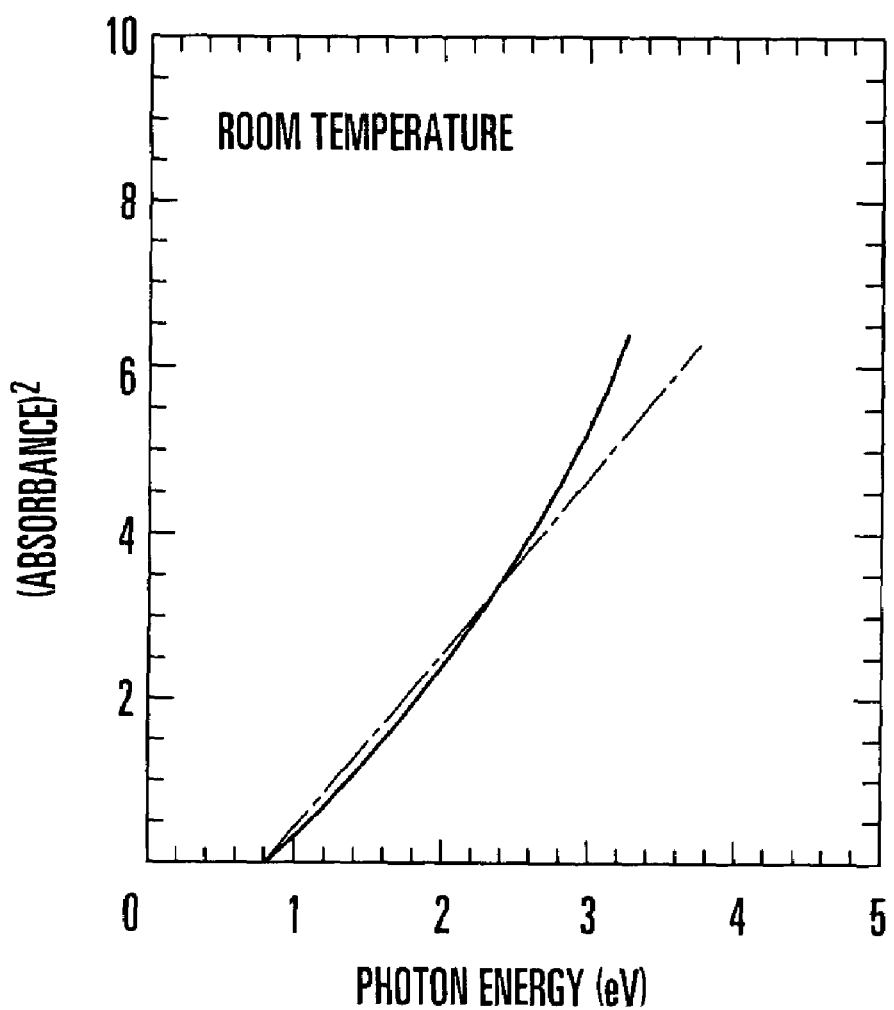
FIG. 5 is a graph showing the relationship between the absorbance squared and the photon energy in a formed InN film.
Figure 6:
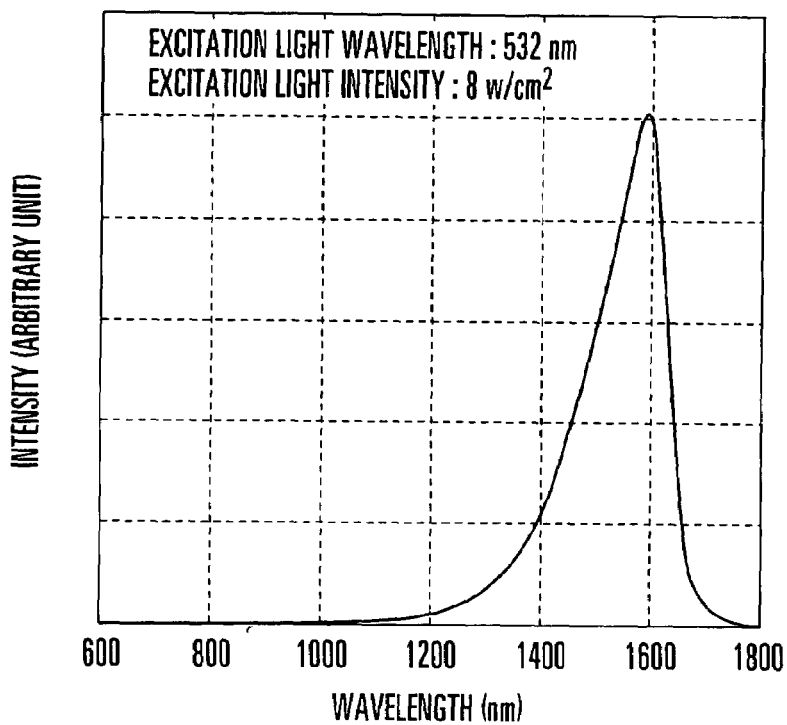
FIG. 6 is a graph showing the photoluminescence characteristic measured at room temperature from the InN film.

FIGS. 5 and 6 show the characteristics of a grown InN film. FIG. 5 shows the relationship between absorbance squared and photon energy in the grown film. As shown in FIG. 5, in the grown InN film, a clear absorption edge is detected from optical absorbance. Since this relationship is almost linear, InN can be regarded as a direct transition type, and the Eg can be estimated as about 0.8 eV.

FIG. 6 shows the photoluminescence measured at room temperature from the InN film grown under the above conditions. It is obvious that light emission occurred near a wavelength of 1.59 μm (0.8 eV). Both the measurement results of absorbance and photoluminescence shown in FIGS. 5 and 6 indicate that the Eg of the InN film grown under the above condition is 0.8 eV. From these results, it can be estimated that the Eg of InN is near 0.8 eV.

Figure 7:
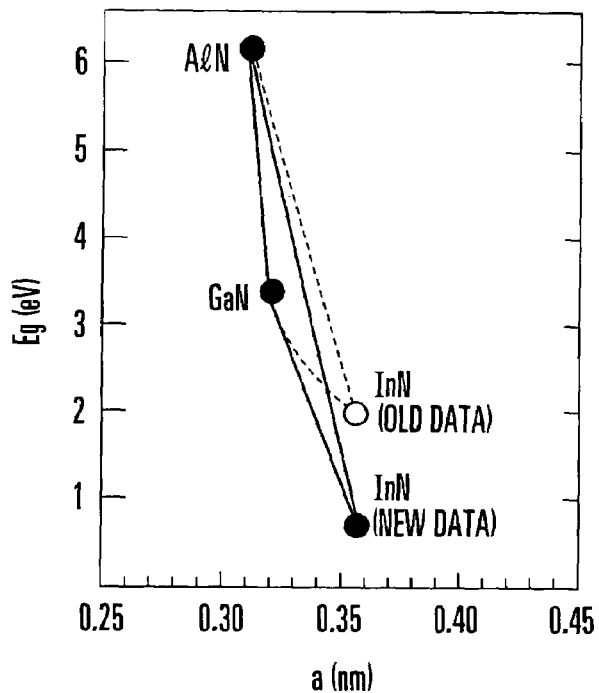
FIG. 7 is a graph showing the relationship between the Eg and a lattice constant a of the a-axis in the InGaAlN system.

The above various technical improvements and longtime efforts have revealed for the first time that the Eg of single-crystal InN is 0.8 eV which is ½ or less of the measurement results in the past. FIG. 7 shows the relationship between the Eg of InGaAlN and a lattice constant a of the a-axis. The broken curves represent the conventional data, and the solid curves represent the result in which the data (Eg=0.8 eV) obtained by the present inventors is reflected.

The compositions of the barrier layer 151 and quantum-well layer 152 constructing the light absorption layer 105 may therefore be properly selected such that the barrier layer 151 has a higher band-gap energy within the triangle defined by the three filled circles in FIG. 7. For example, the quantum-well layer 152 may be made of undoped GaN and the barrier layer 151 may be made of undoped AlN. However, a combination of materials and a crystal growth process must be considered so as not to make the sum of the magnitudes of piezoelectric polarization and spontaneous polarization become 0.

A method of manufacturing the semiconductor optical modulator shown in FIGS. 1A and 1B will be described next. First of all, a metalorganic vapor phase epitaxy apparatus having a vertical-type reactor is used for crystal growth for the formation of each crystal layer. As a nitrogen source, ammonia is used. As a carrier gas, nitrogen gas is used for the growth of a quantum-well structure, and hydrogen gas is used for the growth of other crystal layers. The growth pressure is set to atmospheric pressure. The substrate temperature is set at 1,050° C., and the surface of the single-crystal substrate 101 made of sapphire is nitrided in an ammonia atmosphere to form a very thin nitride layer on the single-crystal substrate 101. The nitride layer is a very thin layer (not shown). Thereafter, the substrate temperature is set at 550° C., and the buffer layer 102 is formed by growing GaN. In the growth of this GaN, triethylgallium (TEG) is used as a gallium source, which has a relatively low gallium vapor pressure. Subsequently, the single-crystal substrate 101 is annealed at 1,050° C. for 9 min to change the buffer layer 102 into a single crystal in the solid phase.

The temperature of the single-crystal substrate is then set at 1,020° C., and Mg-doped p-type GaN and Mg-doped p-type $Al_{0.1}Ga_{0.9}N$ are sequentially grown to form the electrode layer 103 and cladding layer 104, respectively. As an aluminum source for the vapor phase growth of these layers, trimethylaluminum (TMA) is used. As a gallium source, trimethylgallium (TMG) is used. As a source for Mg doping, methylcaptan biscyclopentadienylmagnesium ($MeCP_2Mg$) is used. This source is a liquid, which is advantageous in reproducibility of the doping concentration of Mg over biscyclopentadienylmagnesium which is a generally used solid source.

GaN and InN crystals are alternately grown on the cladding layer 104 to form a multilayer structure (MQW structure) constructed by the barrier layers 151 and quantum-well layers 152. In crystal growth of InN, since the equilibrium vapor pressure of nitrogen on the solid phase of InN is high, the growth temperature (substrate temperature) is set to, for example, 575° C. As an In source in this crystal growth, trimethylindium (TMI) may be used.

In the crystal growth of InN, in order to grow high-quality InN by preventing precipitation of metal In, the ratio of ammonia to TMI, i.e., V/III, is set to 660,000. Nitrogen is used both as a carrier gas and a bubbling gas. This is because the use of hydrogen as a carrier gas will suppress the decomposition of ammonia (see non-patent reference 5).

Figures 8A, 8B, 8C:
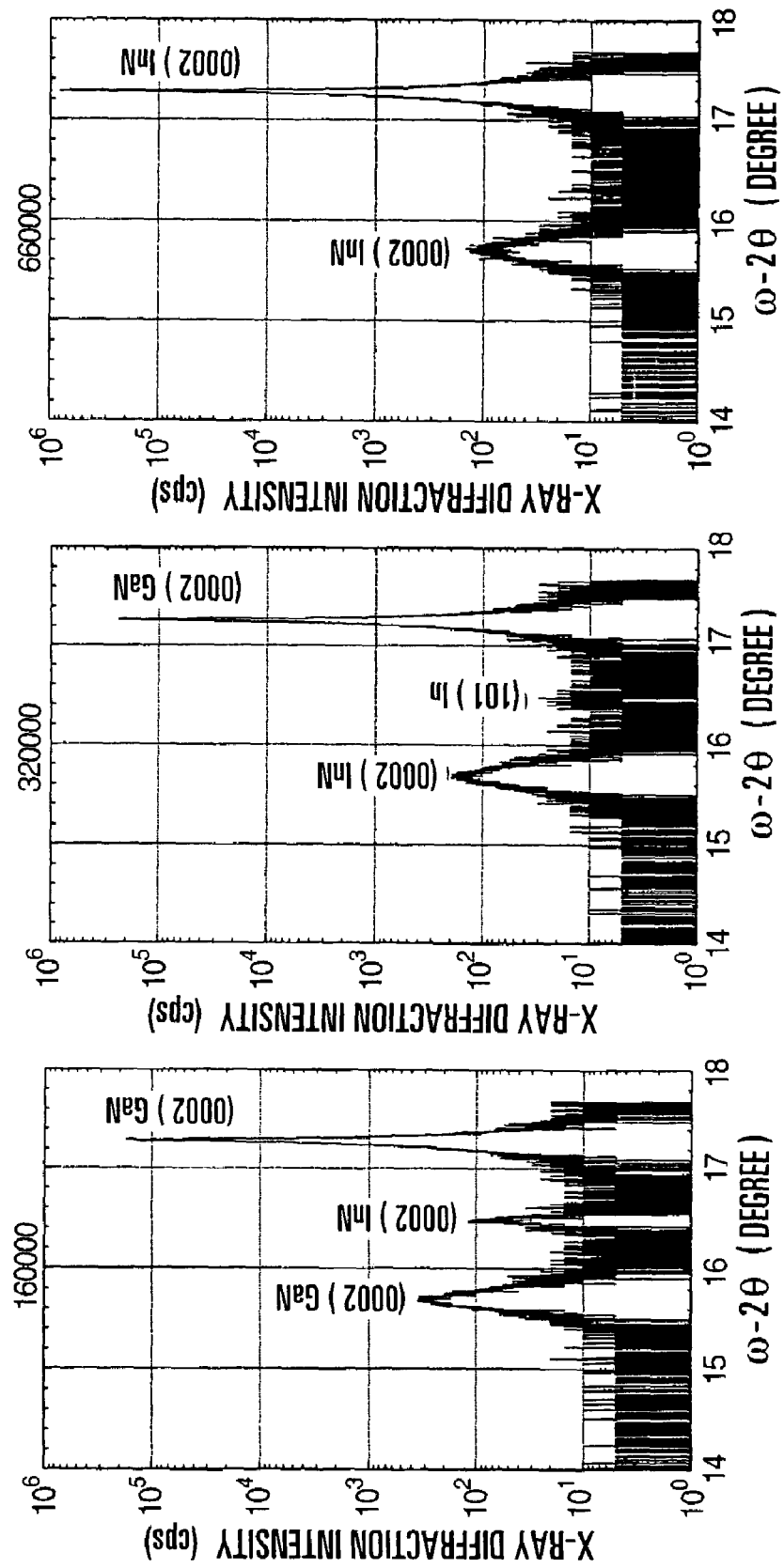
FIG. 8A is a graph showing the X-ray diffraction spectrum of InN grown under the condition that a ratio V/III (ammonia/indium) of the amount of ammonia supplied to a reactor to the amount of trimethylindium (TMI) as an indium source supplied to the reactor is set to 160,000.
FIG. 8B is a graph showing the X-ray diffraction spectrum of InN grown under the condition that the ratio V/III (ammonia/indium) of the amount of ammonia supplied to the reactor to the amount of trimethylindium (TMI) as an indium source supplied to the reactor is set to 320,000.
FIG. 8C is a graph showing the X-ray diffraction spectrum of InN grown under the condition that the ratio V/III (ammonia/indium) of the amount of ammonia supplied to the reactor to the amount of trimethylindium (TMI) as an indium source supplied to the reactor is set to 660,000.

FIGS. 8A, 8B, and 8C show, as an example of the relationship between growth conditions for InN and crystallinity, the X-ray diffraction spectra of InN grown while a ratio V/III (ammonia/indium) of the amount of ammonia as a nitrogen source supplied to the reactor to the amount of trimethylindium (TMI) as an indium source supplied to the reactor is changed. FIGS. 8A, 8B, and 8C show ω-2θ scan spectra. As shown in FIGS. 8A and 8B, in the films formed under the conditions that V/III is set to 160,000 or less and to 320,000, signals from metal indium are observed. In contrast to this, in the film formed under the condition that V/III is set to 660,000 as shown in FIG. 8C, the peak of metal indium disappears, and hence it is known that no metal indium is contained.

When a GaN playing a role as the barrier layer 151 is to be grown on the high-quality InN crystal grown in the above manner, nitrogen is used as a carrier gas to prevent a deterioration in crystallinity upon etching InN, and the substrate temperature is set to 575° C., which is the same temperature as in the growth of InN.

After predetermined numbers of barrier layers 151 made of GaN and quantum-well layers 152 made of InN are sequentially stacked on each other to form the light absorption layer 105, the substrate temperature is raised to 1,020° C. to sequentially grow Si-doped n-type $Al_{0.1}Ga_{0.9}N$ and Si-doped n-type GaN, thereby forming the cladding layer 106 and contact layer 107, respectively.

Silane ($SiH_4$) gas which is diluted with hydrogen and has a concentration of 1 ppm is used to dope each layer with Si. The same source is used for Si doping in other processes.

After the cladding layer 106 and contact layer 107 are formed, the resultant structure is annealed in a nitrogen atmosphere at 700° C. for 30 min to activate Mg added to these layers.

A 50-nm thick aluminum film and 20-nm thick gold film are sequentially deposited by using an electron beam deposition apparatus, thereby forming a metal layer serving as the n-type metal electrode 108. A novolac-based positive photoresist pattern is formed on the metal layer by the known photolithography technique. The lower layer is etched by using this pattern as a mask to form an exposed region on the electrode layer 103. In this etching process, for example, the crystal layer may be etched by reactive ion etching using chlorine gas.

After etching for the formation of the above exposed region, removal of the photoresist pattern, and cleaning of the single-crystal substrate 101 and the structure formed thereon, a 50-nm thick nickel film and 200-nm thick gold film are sequentially deposited on the exposed region of the electrode layer 103, and the resultant structure is patterned to form the p-type metal electrode 109.

After the manufacturing process is completed up to the formation of the p-type metal electrode 109 in the above manner, the lower surface of the single-crystal substrate 101 is polished so as to thin the single-crystal substrate 101 to a thickness of 80 μm, and the lower surface is mirror-finished. When the single-crystal substrate 101 is removed from the polishing base without mirror-finishing the lower surface, the single-crystal substrate 101 may warp or crack. For this reason, the lower surface is mirror-finished. Thereafter, the resultant structure is cleaned, and predetermined portions are cut by cleavage, thereby obtaining the semiconductor optical modulator with a device length of 1 mm shown FIGS. 1A and 1B.

The band structure in the above MQW structure (light absorption layer 105) and the polarity of a crystal that is important for the polarization effect will be described below. GaN of the barrier layers 151 constructing the light absorption layer 105 is grown in the order of a nitrogen atom, gallium atom, nitrogen atom, and gallium atom in the direction from the lower surface of the single-crystal substrate 101 to the upper surface of it, i.e., in the order of a group V atom, group III atom, group V atom, and group III atom. This stacking order of atoms is generally called + (plus) polarity.

In a crystal growth method such as MOVPE or MBE, when a high-quality crystal is obtained, growth with the above polarity dominantly occurs. Even if − (minus) polarity in the reverse direction to + polarity and + polarity exist together at the start of crystal growth, a growth mode with + polarity generally serves as a dominant mode under growth conditions for high-quality crystals. When a crystal grows to a certain thickness, all the growth modes become modes with + polarity. When a crystal is grown with + polarity, an MQW structure has a band structure like the one shown in FIG. 2A. Note that each crystal layer can also be grown with − polarity depending on the substrate selected. In this case, the gradient of the band structure is in the reverse state to that in FIG. 2A. When each crystal is grown with − polarity, the gradient of each band structure has a gradient slanting to the right unlike the state shown in FIG. 2A. In this case, application of a reverse bias voltage will reduce the gradient of the band.

In addition, each crystal layer can be formed with − polarity in the following manner even by using the same substrate as that used for the semiconductor optical modulator according to this embodiment. For example, first of all, the surface of a c-plane sapphire substrate is nitrided in advance by exposing it to an ammonia atmosphere at a high temperature. A buffer layer made of GaN is grown on the sapphire substrate having undergone this nitridation process at a low temperature to a predetermined thickness. The growth process is then interrupted for a predetermined period of time. During this interruption of the grown process, the buffer layer which has already been formed is annealed at a high temperature of 1,000° C. or higher.

Subsequently, GaN is grown at a high temperature of 1,000° C. or higher to form a single-crystal GaN layer with −polarity. This technique is known as a two-step growth method. The single-crystal GaN layer with − polarity formed in this manner has a rocking curve with of 40 sec or less, which is obtained by X-ray diffraction. Single-crystal GaN with + polarity has a rocking curve width of 100 sec or more. Obviously, therefore, as compared with this, the above single-crystal GaN layer with − polarity has good crystallinity.

The operating characteristics of the semiconductor optical modulator according to the above embodiment will be described next. Assume that the modulator is operated with the n-type metal electrode 108 and p-type metal electrode 109 shown in FIGS. 1A and 1B serving as a cathode and anode, respectively. That is, the modulator is operated while a voltage is applied to the diode in the forward direction. By applying a voltage in this manner, the gradient of the band of the quantum-well layer 152 made of InN shown in FIG. 2A can be reduced or leveled. Furthermore, the gradient can be reversed. In this embodiment, the modulator is operated without injecting any current.

Figure 9:
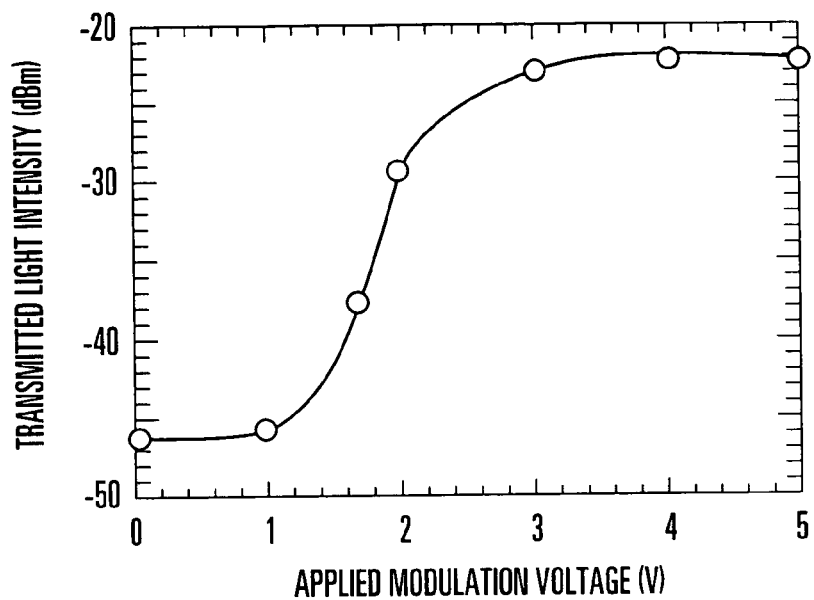
FIG. 9 is a graph showing the relationship between the applied modulation voltage and the transmitted light intensity in the semiconductor optical modulator according to this embodiment.

FIG. 9 shows the characteristics of the semiconductor optical modulator according to this embodiment, i.e., the relationship between the applied modulation voltage and the transmitted light intensity. As shown in FIG. 9, this semiconductor optical modulator is operated by a forward bias. The wavelength of light from a light source used to investigate the characteristics in FIG. 9 is 1.53 μm, and the intensity of light input into the device is 10 μW.

In the light absorption layer 105, the thickness of the quantum-well layer 152 and a combination of $In_{1-X-Y}Ga_XAl_YN$ ($0 \leq X, Y \leq 1$, $0 \leq X+Y \leq 1$) compositions forming the quantum-well layers 152 and barrier layers 151 are properly designed in consideration of the polarization effect, thereby allowing the selection of a wavelength that can be modulated.

Figure 10:
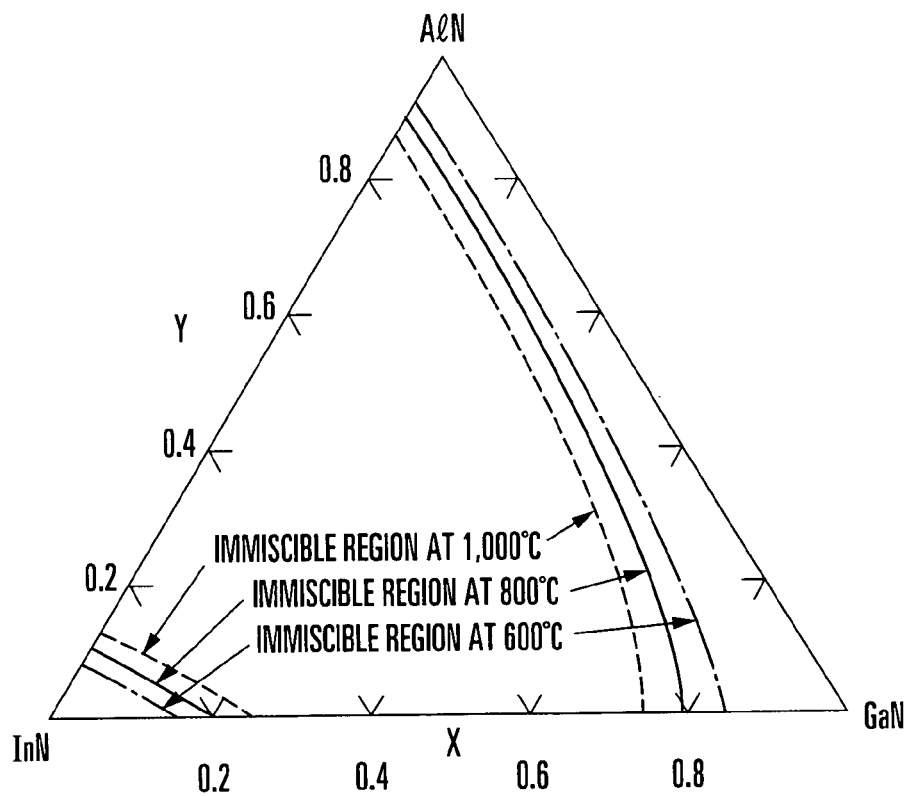
FIG. 10 is a graph showing the miscible and immiscible regions in crystal growth of the InGaAlN system.

Note that a combination of $In_{1-X-Y}Ga_XAl_YN$ ($0 \leq X, Y \leq 1$, $0 \leq X+Y \leq 1$) compositions to be used for a light absorption layer is determined in consideration of the phase separation. As shown in FIG. 10, in the crystal growth of an InGaAlN-based material, since an immiscible region exists and the phase separation occurs under the condition of the immiscible region, no crystal can be grown. FIG. 10 shows the immiscible regions of InGaAlN obtained by experiment and calculation (see non-patent reference 6). Referring to FIG. 10, the chain lines indicate the immiscible region of InGaAlN when it grows at 600° C.; the solid lines, the immiscible region of InGaAlN when it grows at 800° C.; and the dashed lines, the immiscible region of InGaAlN when it grows at 1,000° C. The regions inside the respective lines are the immiscible regions.

If, therefore, compositions are determined in consideration of the condition of the miscible region shown in FIG. 10, an MQW structure using an InGaAlN-based material can be realized. Since InN and GaN that form the light absorption layer 105 in the embodiment shown in FIGS. 1A and 1B are binary compounds, no phase separation like that described above occurs, providing conditions for easier manufacturing. The barrier layers 151 and quantum-well layers 152 are formed with their crystal lattice constants being mismatched. However, InGaAlN compositions may be determined in consideration of the characteristics of the InGaAlN-based materials shown in FIG. 7.

Figure 11:
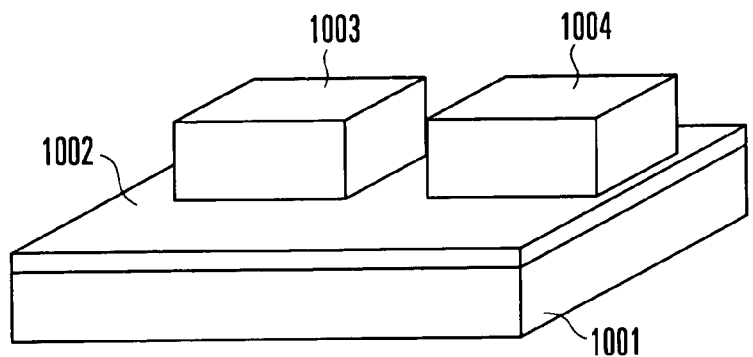
FIG. 11 is a perspective view showing an example of the arrangement of a laser with an optical modulator.

A semiconductor laser diode with an optical modulator can be realized by monolithically integrating the semiconductor optical modulator of this embodiment shown in FIGS. 1A and 1B with a semiconductor laser. For example, as shown in FIG. 11, an optical modulator of the external modulation scheme can be formed by forming an n-type GaN layer 1002 on an n-type semiconductor substrate 1001 and integrally forming, on the n-type GaN layer 1002, a waveguide-type semiconductor laser 1003 and a semiconductor optical modulator 1004 having the layer arrangement shown in FIGS. 1A and 1B while the optical axes of the laser 1003 and the modulator 1004 are aligned with each other. The semiconductor laser 1003 is formed from a general nitride semiconductor material.

As an electrode, a common n-type electrode may be formed on the n-type GaN layer 1002, and p-type electrodes may be separately formed on the semiconductor laser 1003 and semiconductor optical modulator 1004. According to this arrangement, a common cathode can be formed to simplify the circuit arrangement. This allows optical modulation with higher frequencies. Referring to FIG. 11, a space is ensured between the semiconductor laser 1003 and the semiconductor optical modulator 1004. However, the present invention is not limited to this. These components may be arranged in tight contact with each other by using a known structure such as Butt-joint. Alternatively, the semiconductor laser 1003 may be optically coupled to the semiconductor optical modulator 1004 by another technique.

The respective layers constituting the semiconductor laser 1003 are doped with various kinds of impurities. This, however, hardly affect the semiconductor optical modulator 1004.

As described above, the semiconductor optical modulator of this embodiment is operated by a forward bias, there is no need to form a high-impurity crystal layer resistant to a high reverse bias. The existence of impurities poses no serious problem.

Although the forward bias structure has been described above, the above structure may be operated as a reverse bias structure by applying a reverse bias. For example, the electrode layer 103 shown in FIGS. 1A and 1B is formed from n-type GaN. Likewise, the cladding layer 104, cladding layer 106, and contact layer 107 are respectively formed from n-type $Al_{0.1}Ga_{0.9}N$, p-type $Al_{0.1}Ga_{0.9}N$, and p-type GaN. A p-type metal electrode is then formed on the contact layer 107, and an n-type metal electrode is formed on the electrode layer 103. The n-type metal electrode and p-type metal electrode can be operated as an anode and cathode, respectively.

In the above embodiment, a metal electrode is directly formed on a semiconductor layer such as the contact layer 107. However, an insulating layer may be formed in place of the contact layer 107, and a metal electrode may be formed on the insulating layer. Forming this insulating film makes it possible to prevent injection of carriers into the light absorption layer 105 more reliably.

In addition, a quantum-well layer of a light absorption layer may have a lattice constant smaller than that of a barrier layer, and the spontaneous polarization of the quantum-well layer may differ in magnitude from the piezoelectric polarization produced in the quantum-well layer. In this case, a reverse bias can be applied most efficiently by making the directions of spontaneous polarization and piezoelectric polarization coincide with each other and also coincide with the direction of a reverse bias. If spontaneous polarization differs in direction from piezoelectric polarization, the sum of the two polarizations exists. It suffices if the direction of the sum coincides with the reverse bias direction.

Second Embodiment

Another embodiment of the present invention will be described next.

Figure 12:
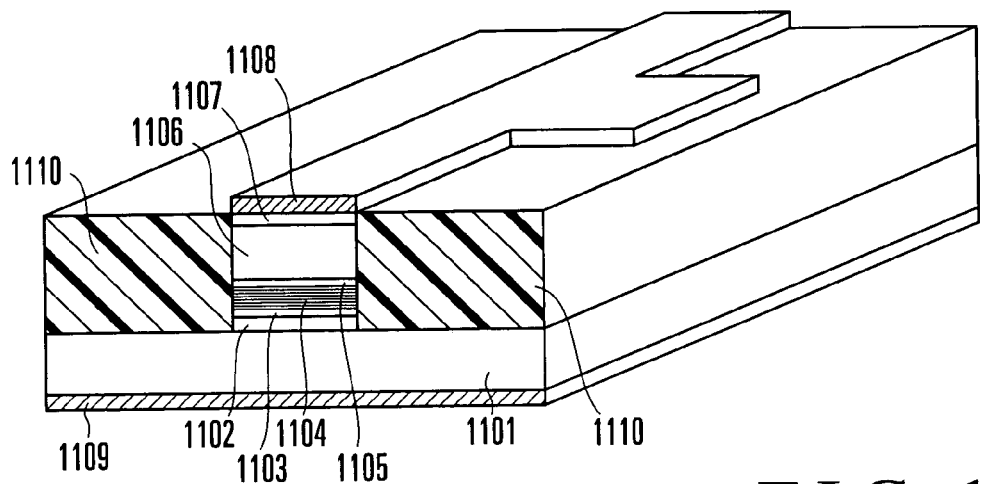
FIG. 12 is a schematic perspective view showing an example of the arrangement of a semiconductor optical modulator according to another embodiment of the present invention.

FIG. 12 schematically shows an example of the arrangement of a semiconductor optical modulator according to another embodiment of the present invention.

In this semiconductor optical modulator, a light absorption region in the form of a ridge is formed on the surface of a 300-µm thick substrate 1101 made of n-type GaN. The light absorption region is constructed by a lower cladding layer 1102 which is about 1.5 µm thick and made of Si-doped n-type $Al_{0.1}Ga_{0.9}N$, a 0.5-µm thick lower SCH (Separate Confinement Hetero) layer 1103 made of undoped InGaAlN, a light absorption layer 1104 having an MQW structure, a 5-µm thick upper SCH layer 1105 made of undoped InGaAlN, a 1.5-µm thick upper cladding layer 1106 made of Mg-doped p-type $Al_{0.1}Ga_{0.9}N$, and a 0.1-µm thick contact layer 1107 made of Mg-doped p-type GaN. The light absorption layer 1104 is an MQW structure formed by alternately stacking well layers made of $In_{1-X-Y}Ga_XAl_YN$ ($0 \leq X, Y \leq 1, 0 \leq X+Y \leq 1$) and barrier layers made of $In_{1-X'-Y'}Ga_{X'}Al_{Y'}N$ ($0 \leq X', Y' \leq 1, 0 \leq X'+Y' \leq 1$).

For example, polyimide layers 1110 are buried in two side portions of the light absorption region which is formed by stacking these layers so as to form a ridge structure. The upper surface of the contact layer 1107 is almost flush with the upper surface of the polyimide layer 1110.

A p-type electrode 1108 having a multilayer structure constituted by a 50-nm thick nickel layer in direct contact with the contact layer 1107 and a 200-nm thick gold layer formed on the nickel layer is formed on the contact layer 1107. An n-type electrode 1109 having a multilayer structure constituted by a 50-nm thick aluminum layer in direct contact with the substrate 1101 and a 200-nm thick gold layer is formed on the lower surface of the substrate 1101.

As described above, the semiconductor optical modulator shown in FIG. 12 has the SCH structure in which the cladding layers provided on the upper and lower surfaces of the light absorption layer 1104 are constituted by the lower cladding layer 1102, lower SCH layer 1103, upper SCH layer 1105, and upper cladding layer 1106.

The SCH structure will be described below. In the above optical modulator, the incident light must be confined in the light absorption layer 1104. If the thickness of the light absorption region is about ⅒ or more the wavelength of light, light can be confined by using a double-heterostructure. In contrast to this, if the light absorption region has a thin quantum-well structure, light widely spreads in the cladding layer. As a consequence, the degree of confinement of light in the active layer decreases.

If the second cladding layer having an intermediate refractive-index between those of the cladding layer and light absorption layer is inserted therebetween, the electric field distribution of light confined in the light absorption layer becomes much higher than that of the double-heterostructure. A waveguide structure using the second cladding layer is the above SCH structure. In the semiconductor optical modulator in FIG. 11, the lower SCH layer 1103 and upper SCH layer 1105 correspond to the second cladding layer.

In the present invention, since the light absorption layer has a quantum-well structure, the use of an SCH structure as in the semiconductor optical modulator in FIG. 12 enhances the effect of confining light in the light absorption layer, thereby improving the absorbance of the light absorption layer.

Note that the above cladding layer and second cladding layer used in the above SCH structure are configured to have larger band-gap energy than the active region (light absorption region).

Figure 13:
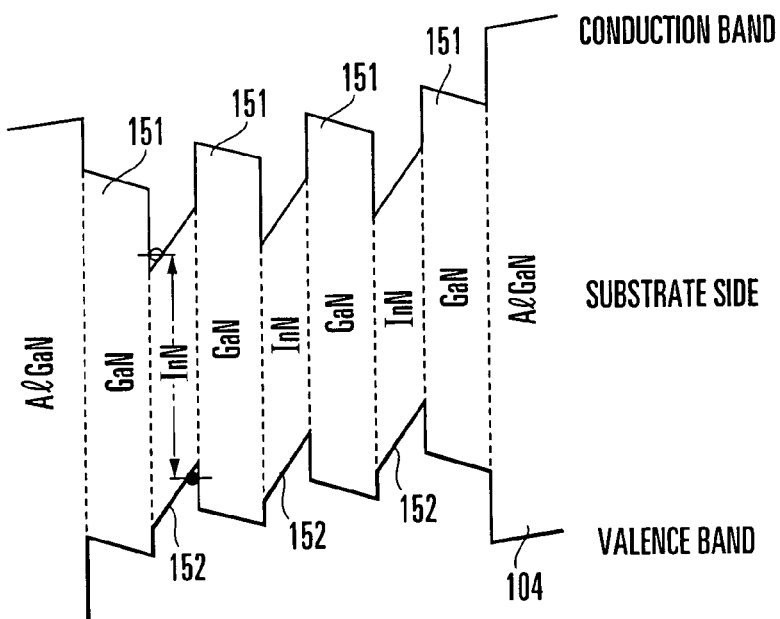
FIG. 13 is a band diagram showing an example of the band structure of part of the semiconductor optical modulator according to the embodiment of the present invention.
Figure 14:
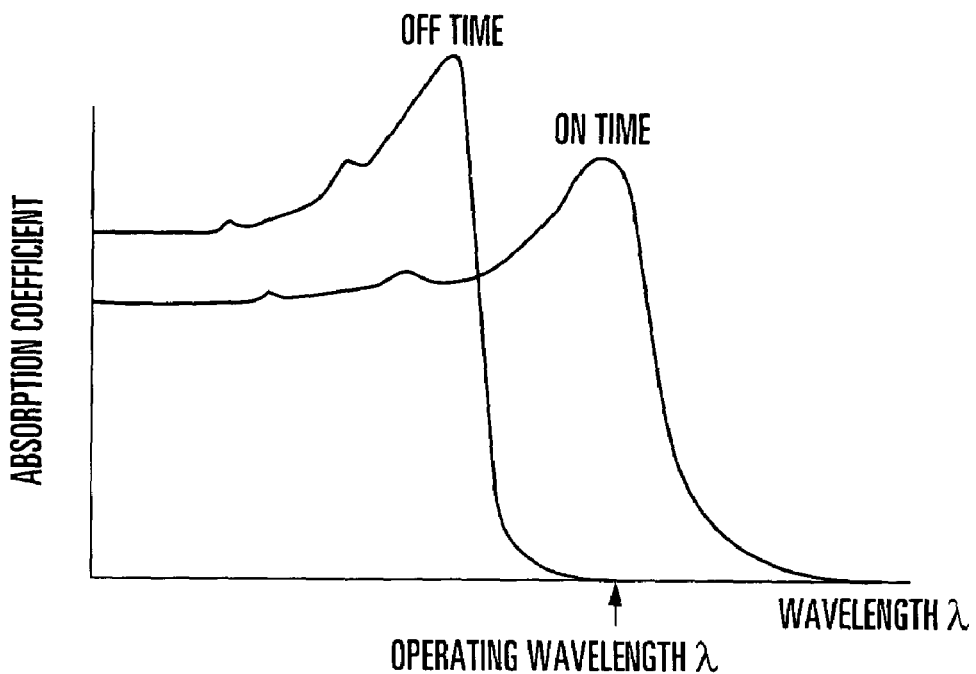
FIG. 14 is a graph showing the dependence of light absorption characteristics on a wavelength λ of incident light at the time when no voltage is applied and at the time when a reverse bias is applied.
Figure 15:
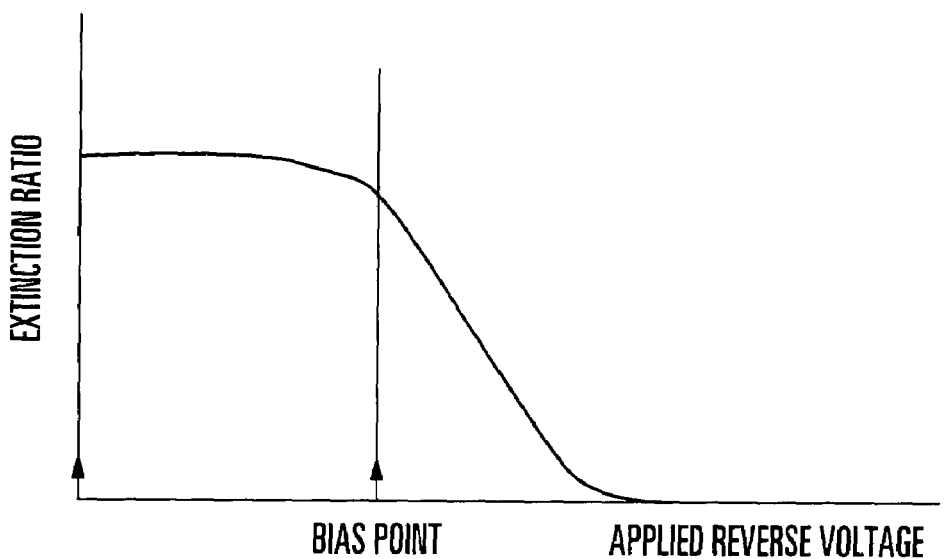
FIG. 15 is a graph showing the voltage dependence of an extinction ratio.

The case wherein a reverse bias is applied has been described with reference to FIGS. 2A and 2B. If a reverse bias is applied, the state shown in FIG. 2A is changed into the state shown in FIG. 13 wherein the gradient of the band increases, and the energy between an electron and a hole in a quantum-well layer 152 becomes lower than that in the absence of a bias. As a result, the absorption-edge wavelength increases. That is, if the wavelength of light incident on the light incident end of the semiconductor optical modulator in FIGS. 1A and 1B is longer than the absorption edge wavelength in the absence of a bias and shorter than the absorption edge wavelength upon application of a revere bias, the light is transmitted through the modulator and output only when no bias is applied.

As described above, in the second embodiment as well, the light absorption region is depleted by the built-in voltage generated upon formation of a polarization electric field and p-n junction. Therefore, optimal operation can be realized without externally applying a reverse bias DC voltage, and high-speed operation can be realized for modulation of high-intensity light without accumulating carriers. In addition, according to this embodiment, since the upper and lower SCH layers and light absorption layer (multiple-quantum-well layer) are depleted by a polarization electric field, the thickness of the upper and lower SCH layers can be reduced to the minimum necessary to confine light. According to this embodiment, such a reduction in thickness makes it possible to reduce the ineffective voltage components produced by the SCH layers, and allows an external modulation voltage to contribute to optical modulation very effectively. This can realize low-voltage driving. In addition, according to this embodiment, the number of MQW layers of a light absorption layer can be increased by the extent to which the upper and lower SCH layers are thinned. According to the embodiment, therefore, the extinction characteristic can be changed more steeply with respect to voltage, thus realizing operation at lower voltages. In addition, a semiconductor optical device can be provided, which exhibits small nonlinearity with respect to driving voltage.

As has been described above, according to the present invention, in the quantum-well structure forming the light absorption layer, each quantum-well layer is made of $In_{1-X-Y}Ga_XAl_YN$ ($0 \leq X, Y \leq 1, 0 \leq X+Y \leq 1$), and each barrier layer is made of $In_{1-X'-Y'}Ga_{X'}Al_{Y'}N$ ($0 \leq X', Y' \leq 1, 0 \leq X'+Y' \leq 1$). Therefore, the light absorption layer is made of a material with a small Auger effect, and stands the influences of operating temperatures.

Spontaneous polarization is always produced in a quantum-well layer serving as a light absorption layer. According to the present invention, an electric field is generated in the light absorption layer even in the absence of a bias voltage so as to incline the gradient of the band of the quantum-well layer forming the light absorption layer. As a consequence, according to the present invention, by making the gradient of the band of the quantum-well more gentle by applying a signal voltage, the bonding energy of an exciton which is constituted with an electron and a hole can be increased, and the wavelength of absorbed light can be changed. As a consequence, according to the present invention, for example, modulation can be performed by operation using a forward bias.

In the semiconductor optical device according to the present invention, even with increases in the amount of residual impurities in the MQW layer and p-type and n-type dopants in the MQW layer due to diffusion of the impurities in the upper and lower cladding layers, the MQW layer is completely depleted by polarization electric field and the built-in voltage generated by the formation of a p-n junction, and optimal operation can be realized without externally applying a reverse bias voltage. This equally applies to a device having an SCH layer. Even if the amount of dopants in the SCH layer increases, the SCH layer can be depleted. This makes it unnecessary to use an additional circuit such as a bias T for externally applying a reverse bias voltage. In addition, no DC power supply unit is required. Furthermore, since low-modulation-voltage operation is realized, requirements for a driver for driving the modulator are reduced. This makes it possible to reduce the cost of the driver and power consumption. Therefore, great reductions in the size and cost of the transmission apparatus can be achieved.

In addition, the lattice constant of each barrier is set to be larger than that of each quantum-well layer to distort the quantum-well layer, thereby producing piezoelectric polarization in addition to the above spontaneous polarization. This makes it possible to generate an electric field in the light absorption layer even in the absence of a bias voltage and incline the gradient of the band of the quantum-well layer forming the light absorption layer. If, however, spontaneous polarization such as tensile strain differs in direction from piezoelectric polarization, the compositions of each quantum-well layer and each barrier layer are combined to make the magnitude of the spontaneous polarization differ from that of the piezoelectric polarization.

There is no need to apply a high DC reverse bias, which is used for a conventional semiconductor optical modulator, to the semiconductor optical modulator and the laser with the semiconductor optical modulator according to the present invention. Depending on the arrangement of the present invention, no DC bias is required to be applied. For this reason, there is no need to form a high-quality crystal that is resistant to a reverse bias. This increases the margin of a crystal growth process. As a consequence, the manufacturing yield of devices can be improved, and devices can be provided at lower cost. In addition, since there is no need to apply a high reverse bias, the service life of the device can be prolonged. Constructing a communication system using the devices of the present invention can improve reliability.

What is claimed is:

1. A semiconductor optical modulator comprising at least:
   a lower cladding layer of a first conductivity type;
   a light absorption layer which is formed on said lower cladding layer and has a quantum-well structure constituted by a quantum-well layer and a barrier layer; and
   an upper cladding layer of a second conductivity type formed on said light absorption layer,
   wherein the quantum-well layer is made of $In_{1-x-y}Ga_xAl_yN$ ($0 \leq x, y \leq 1, 0 \leq x+y \leq 1$),
   the barrier layers is made of $In_{1-x'-y'}Ga_{x'}Al_{y'}N$ ($0 \leq x', y' \leq 1, 0 \leq x'+y' \leq 1$),
   an optical waveguide having a light incident end is constituted by said lower cladding layer, said light absorption layer, and said upper cladding layer,
   polarization is produced in the light absorption layer in the absence of a bias, and
   the light absorption layer is depleted by the polarization and a p-n junction built-in voltage such that the modulator is modulating light by depleting light absorption layer.

2. A modulator according to claim 1, wherein said light absorption layer includes a multiple-quantum-well structure.

3. A modulator according to claim 1, wherein said lower cladding layer is formed on a predetermined substrate.

4. A modulator according to claim 1, wherein the polarization is spontaneous polarization produced in said light absorption layer.

5. A modulator according to claim 1, wherein the polarization is the sum of spontaneous polarization and piezoelectric polarization produced in said light absorption layer.

6. A modulator according to claim 1, wherein the quantum-well layer and the barrier layer have different lattice constants.

7. A modulator according to claim 6, wherein the quantum-well layer has a larger lattice constant that the barrier layer.

8. A modulator according to claim 6, wherein the quantum-well layer has a smaller lattice constant than the barrier layer.

9. A modulator according to claim 1, wherein the quantum-well layer comprises crystal InN, and the barrier layer comprises crystal GaN.

10. A laser with an optical modulator, comprising a waveguide type semiconductor laser and a semiconductor optical modulator which are integrated on a single substrate, wherein said semiconductor optical modulator includes at least a lower cladding layer of a first conductivity type formed on a substrate, a light absorption layer which is formed on the lower cladding layer and has a quantum-well structure constituted by a quantum-well layer and a barrier layer, and an upper cladding layer of a second conductivity type formed on the light absorption layer, the quantum-well layer is made of $In_{1-x-y}Ga_xAl_yN$ ($0 \leq x$, $y \leq 1$, $0 \leq x+y \leq 1$), the baffler layers is made of $In_{1-x'-y'}Ga_{x'}Al_{y'}N$ ($0 \leq x'$, $y' \leq 1$, $0 \leq x'+y' \leq 1$), an optical waveguide having a light incident end is constituted by the lower cladding layer, the light absorption layer, and the upper cladding layer, polarization is produced in the light absorption layer in the absence of a bias, and the light absorption layer is depleted by the polarization and a p-n junction built-in voltage such that the modulator is modulating light by depleting light absorption layer.

11. A laser according to claim 10, wherein said optical modulator includes a multiple-quantum-well structure.

12. A laser according to claim 10, wherein the polarization is spontaneous polarization produced in the light absorption layer.

13. A laser according to claim 10, wherein the polarization is the sum of spontaneous polarization and piezoelectric polarization produced in the light absorption layer.

14. A laser according to claim 10, wherein the quantum-well layer has a larger constant than the barrier layer.

15. A laser according to claim 14, wherein the quantum-well layer has a larger constant than the barrier layer.

16. A laser according to claim 14, wherein the quantum-well layer has a smaller lattice constant than the barrier layer.

17. A laser according to claim 11, wherein the quantum-well layer comprises crystal InN, and the barrier layer comprises crystal GaN.

18. A semiconductor optical modulator comprising at least:
   a lower cladding layer of a first conductivity type;
   a light absorption layer which is formed on said lower cladding layer and has a quantum-well structure constituted by a quantum-well layer and a barrier layer; and
   an upper cladding layer of a second conductivity type formed on said light absorption layer,
   wherein the quantum-well layer is made of $In_{1-x-y}Ga_xAl_yN$ ($0 \leq x$, $y \leq 1$, $0 \leq x+y \leq 1$),
   the barrier layers is made of $In_{1-x'-y'}Ga_{x'}Al_{y'}N$ ($0 \leq x'$, $y' \leq 1$, $0 \leq x'+y' \leq 1$),
   an optical waveguide having a light incident end is constituted by said lower cladding layer, said light absorption layer, and said upper cladding layer,
   polarization is produced in the light absorption layer in the absence of a bias, and
   the modulator is operated without injecting any current in the presence of a forward bias.

19. A laser with an optical modulator, comprising a waveguide type semiconductor laser and a semiconductor optical modulator which are integrated on a single substrate,
   wherein said semiconductor optical modulator includes at least
   a lower cladding layer of a first conductivity type formed on a substrate,
   a light absorption layer which is formed on the lower cladding layer and has a quantum-well structure constituted by a quantum-well layer and a barrier layer, and
   an upper cladding layer of a second conductivity type formed on the light absorption layer,
   the quantum-well layer is made of $In_{1-x-y}Ga_xAl_yN$ ($0 \leq x$, $y \leq 1$, $0 \leq x+y \leq 1$),
   the barrier layers is made of $In_{1-x'-y'}Ga_{x'}Al_{y'}N$ ($0 \leq x'$, $y' \leq 1$, $0 \leq x'+y' \leq 1$),
   an optical waveguide having a light incident end is constituted by the lower cladding layer, the light absorption layer, and the upper cladding layer,
   polarization is produced in the light absorption layer in the absence of a bias, and
   the modulator is operated without injecting any current in the presence of a forward bias.

* * * * *

UNITED STATES PATENT AND TRADEMARK OFFICE
CERTIFICATE OF CORRECTION

PATENT NO. : 7,039,078 B2 Page 1 of 1
APPLICATION NO. : 10/665515
DATED : May 2, 2006
INVENTOR(S) : Matsuoka et al.

It is certified that error appears in the above-identified patent and that said Letters Patent is hereby corrected as shown below:

Col. 21, line 34;

In claim #10, Line #12, please delete "baffler" and insert -- barrier --.

Col. 22, line 4;

In claim #17, Line #1, please delete "11" and insert --10 --.

Signed and Sealed this

Fourteenth Day of November, 2006

JON W. DUDAS
*Director of the United States Patent and Trademark Office*